(12) United States Patent
Friman

(10) Patent No.: US 9,835,699 B2
(45) Date of Patent: Dec. 5, 2017

(54) FAIL-SAFE AND EASY ACCESS LOCK FOR MRI RECEIVER COIL

(75) Inventor: Olli Tapio Friman, Gainesville, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 743 days.

(21) Appl. No.: 14/009,378

(22) PCT Filed: Apr. 12, 2012

(86) PCT No.: PCT/IB2012/051791
§ 371 (c)(1),
(2), (4) Date: Oct. 2, 2013

(87) PCT Pub. No.: WO2012/143827
PCT Pub. Date: Oct. 26, 2012

(65) Prior Publication Data
US 2014/0028317 A1    Jan. 30, 2014

Related U.S. Application Data

(60) Provisional application No. 61/476,469, filed on Apr. 18, 2011.

(51) Int. Cl.
*G01V 3/00* (2006.01)
*G01R 33/34* (2006.01)
(Continued)

(52) U.S. Cl.
CPC . *G01R 33/34092* (2013.01); *G01R 33/34007* (2013.01); *G01R 33/30* (2013.01); *G01R 33/3415* (2013.01); *G01R 33/34084* (2013.01)

(58) Field of Classification Search
CPC .... G01R 33/307; G01R 33/30; G01R 33/302; G01N 24/08; A61B 5/0555
(Continued)

(56) References Cited

U.S. PATENT DOCUMENTS 4,264,296 A * 4/1981 Folkerts .................. F23N 3/085
126/285 R
5,085,219 A   2/1992 Ortendahl
(Continued)

FOREIGN PATENT DOCUMENTS

JP    8 071053 A    3/1996

*Primary Examiner* — Walter L Lindsay, Jr.
*Assistant Examiner* — Frederick Wenderoth

(57) ABSTRACT

A local radio frequency (RF) coil assembly (A) defining a pediatric patient receiving region (12) to be mounted to a patient support table (B) of an MRI scanner (E). The local RF coil assembly (A) includes a rigid coil body (16,18) operatively connected to an adjustable coil part (20) along a hinge axis (26). A carrier (F) is configured to receive a pediatric patient (C) and be positioned into engagement with the local RF coil assembly (A). An interlock assembly (51) holds the adjustable coil part (20) in a selected position (50) when the carrier (F) interacts with the adjustable coil part (20). At least one bearing (34, 36) is configured to pivot and bias the adjustable coil part (20) relative to the carrier (F) and gravity bias the interlock assembly and the carrier (F) into an interlocking engagement. The adjustable coil part (20) is gravity biased to the open position (28) when the carrier (F) is removed.

20 Claims, 7 Drawing Sheets

(51) Int. Cl.
    *G01R 33/30* (2006.01)
    *G01R 33/3415* (2006.01)

(58) Field of Classification Search
    USPC .......................................................... 324/321
    See application file for complete search history.

(56) References Cited

U.S. PATENT DOCUMENTS

| | | | |
|---|---|---|---|
| 5,307,806 A * | 5/1994 | Jones | G01R 33/34084 |
| | | | 324/318 |
| 5,664,568 A | 9/1997 | Srinivasan | |
| 6,591,128 B1 * | 7/2003 | Wu | G01R 33/34084 |
| | | | 324/318 |
| 7,394,256 B2 * | 7/2008 | Schubert | G01R 33/34046 |
| | | | 324/307 |
| 7,526,330 B1 * | 4/2009 | Randell | A61B 5/055 |
| | | | 324/309 |
| 7,602,186 B2 | 10/2009 | Hoogeveen | |
| 7,920,910 B2 | 4/2011 | Calderon | |
| 2004/0015074 A1 | 1/2004 | Srinivasan | |
| 2004/0075437 A1 | 4/2004 | Srinivasan | |
| 2005/0107686 A1 | 5/2005 | Chan et al. | |
| 2005/0113668 A1 | 5/2005 | Srinivasan | |
| 2007/0132454 A1 * | 6/2007 | Vaughan | G01R 33/34046 |
| | | | 324/318 |
| 2007/0152667 A1 | 7/2007 | Schubert | |
| 2010/0121180 A1 * | 5/2010 | Biber | G01R 33/34084 |
| | | | 600/422 |

\* cited by examiner

FAIL-SAFE AND EASY ACCESS LOCK FOR MRI RECEIVER COIL

CROSS-REFERENCE TO PRIOR APPLICATIONS

This application is the U.S. National Phase application under 35 U.S.C. §371 of International Application No. PCT/IB2012/051791, filed on Apr. 12, 2012, which claims the benefit of U.S. Provisional Patent Application No. 61/476,469, filed on Apr. 18, 2011. These applications are hereby incorporated by reference herein.

DESCRIPTION

The present application relates to an assembly and method for safely handling a pediatric patient within a magnetic resonance imaging (MRI) scanner. It finds particular application in conjunction with a system for safely handling a pediatric patient within a radio frequency (RF) coil assembly of an MRI scanner sized for use by an adult patient. However, it is to be understood that it also finds application in other diagnostic imaging and patient handling scenarios, and is not necessarily limited to the aforementioned application.

MRI scanners scan a patient to provide detailed images of afflicted areas to aid healthcare providers in their diagnosis of ailments that may be present in the patient. MRI scanners utilize powerful magnetic fields to align protons within the body of a patient. RF fields are applied to alter the alignment of this magnetization which causes the protons to resonate to produce a weak RF field that is detected, recorded and transformed into detailed images of the scanned area. A large magnetic coil produces the main magnetic field and magnetic field gradient coils apply gradient magnetic fields for spatially encoding the resonance RF signal. Additionally, the patient is positioned at a predetermined location within an imaging region of the magnetic coil to allow the MRI scanner to produce quality images of the patient.

When local RF coils are used to receive the resonance signals, patients are aligned and fitted to a local RF coil prior to being inserted into the imaging region of the MRI scanner. RF coils that are too large and cumbersome to attach directly on the patient are often rigidly attached to a patient table that supports the patient and translates the patient into and out of the imaging region. Generally, the patent is fitted to the RF coil on the patient table or elsewhere within a shielded room which prevents the MRI scanner from being used to image other patients during set up. Due to the expense of MRI scanners, medical institutions typically purchase scanners and RF coils that are sized to accept normal adult patients. Smaller scale scanners, sized specifically for smaller sizes of patients, are typically not available in most medical institutions.

Local RF coils are generally large inductors tuned to a defined resonance frequency that are sized in various configurations to cover a region of interest of the patient and be positioned within the imaging region of an MRI scanner. Generally, the image quality of an MRI scanner depends on a signal to noise ratio (SNR) of an acquired signal from a patient in the imaging region. The level of quality of a magnetic resonance image of the human body is a function of the SNR. In certain MRI scanners, it is desirable to place the local RF coil in close position to the region of interest of the patient to increase the signal strength and improve the SNR. Generally, the best available homogeneity of image quality can be reached by use of the appropriate local RF coil type, shape and position about the region of interest of a patient to be imaged.

Moreover, pediatric patients, particularly neonatal patients who need imaging typically have a high risk of experiencing a healthcare emergency and often travel with an array of tubes, monitors and medical accessories. These pediatric patients are fitted with a local RF coil and positioned in the MRI scanner. Local RF coils are closely fitted to the region of interest on the pediatric patient while in the imaging region of MRI scanners. The small size of pediatric patients poses a challenge to hospital personnel. More particularly, local RF coils are held in place with straps, tape and the like. The attachment mechanisms can be difficult to attach to the neonatal patient such that the coil does not shift without harming the patient. In the event of a medical emergency, the attachment mechanisms inhibit immediate emergency access to the patient by hospital personnel to provide emergency care. In these situations, the highest priority is to access the patient to provide care. Difficult to release local RF coils may cause significant delay in the process of accessing the patient. Further, personnel may have to resort to damaging the RF coil and associated MRI equipment while attempting to access the patient within the imaging region of an MRI scanner to provide care or risk further detriment to the health of the patient.

Therefore, there remains a need to provide an assembly and method to safely and quickly access a pediatric patient within the imaging region of an MRI scanner. Further, there is a need for an assembly that accurately and quickly positions a pediatric patient connected to tubes or other medical devices within a local RF coil of an MRI assembly that is sized for a normal adult. Additionally, there is a need for enabling safe and quick access to a pediatric patient positioned within the RF coil and imaging region of the MRI scanner without damaging the RF coil or associated MRI equipment. There is also a need to provide a local RF coil having a biased pivoting RF coil member for selective positioning relative to patients of various sizes to facilitate quality images.

The present application provides a new and improved assembly and method which overcome the above-referenced problems and others.

In accordance with one aspect, a pediatric patient handling system includes a local RF coil assembly defining a pediatric patient receiving region to be mounted to a patient support table of an MRI scanner. The local RF coil assembly is defined by a rigid coil body and an adjustable coil part. The adjustable coil part is operatively connected to the rigid coil body along a hinge axis. A pediatric patient carrier is configured to receive the pediatric patient and slide longitudinally into engagement with the local RF coil assembly with at least a portion of the pediatric patient disposed in the pediatric patient receiving region. The adjustable coil part is arranged to remain in an open position when the carrier is not positioned within the receiving region. The adjustable coil part is adapted to be biased to a closed or selected position and remain in the selected position when the carrier is received in the receiving region. The adjustable coil part is biased to the open position when the carrier is removed therefrom.

In accordance with a more limited aspect, the RF coil assembly utilizes gravity to bias the adjustable coil part from the selected position to the open position. Additionally, the adjustable coil part is held in the selected position by the interaction of an interlock and the carrier. The interlock includes a ratchet member that extends from the adjustable coil part and is biased to engage an abutment surface of the carrier. At least one bearing is aligned on the hinge axis, the bearing is operative to translate and rotate the adjustable coil part relative to the rigid coil body and carrier. As the adjustable coil part is rotated from the open position to the selected position, the bearing is translated away from an equilibrium position in a first direction away from the carrier as a portion of the ratchet member is pivoted in communication with the abutment surface on the carrier. A restoring force is applied to the bearings to linearly translate the adjustable coil part in a second direction towards the carrier to urge teeth from the ratchet member to engage the abutment surface such that the adjustable coil part is held in the selected position.

In accordance with another aspect, a cam member extends from the adjustable coil part and interacts with the carrier in the selected position. The cam member is configured to accelerate the speed at which the adjustable coil part biases to the open position when the carrier is withdrawn from the receiving region.

In one embodiment, the restoring force is provided by gravity due to a weight distribution of the adjustable coil part and the configuration of the hinge with an angled surface on the rigid coil body. In another embodiment the restoring force is provided by a spring or resilient member adapted to urge the hinge in the second direction towards the carrier.

In accordance with another aspect, disclosed is a method for handling the pediatric patient within an MRI scanner sized to accept and scan an adult patient. The method includes receiving a carrier supporting an associated pediatric patient in the local RF coil assembly. The adjustable coil part that is operatively connected to the hinge on the rigid coil body of the local RF coil assembly is biased from an open position towards a selected position relative to the associated patient. The adjustable coil part is translated in a first direction away from the carrier. A portion of the adjustable coil part is engaged against an abutment surface by applying a restoring force against the adjustable coil part to hold the adjustable coil part in a selected position.

One advantage resides in an assembly and method of covering a pediatric patient with a local RF coil in a preferred orientation to facilitate imaging while maintaining the ability to safely and quickly remove the pediatric patient from the local RF coil of an MRI scanner.

Another advantage resides in facilitating imaging of a pediatric, particularly neonatal, patient in an MRI scanner that is sized to accept and scan a full size adult patient.

Yet another advantage resides in positioning a patient accurately within the RF coil and adds flexibility to patient handling.

Yet another advantage resides in ready removal and release of the patient in an emergency.

Still another advantage resides in enabling safe and quick access to a pediatric patient positioned within the RF coil and imaging region of the MRI scanner without damaging the RF coil or associated MRI equipment.

Still further advantages of the present disclosure will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
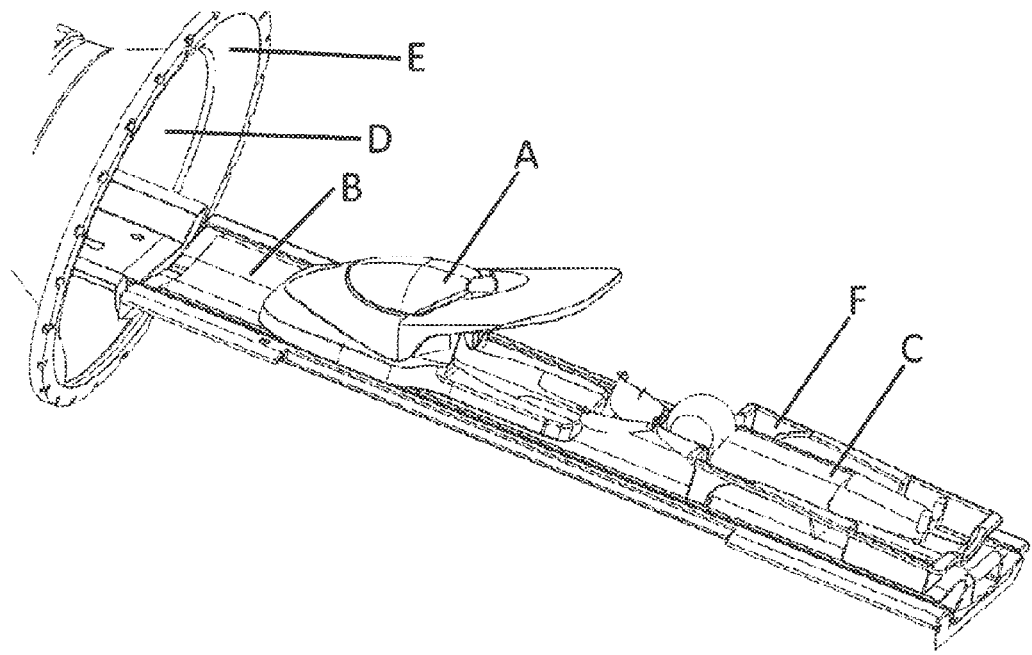
FIG. 1 is a perspective view of a pediatric patient carrier device with an associated pediatric patient ready to engage a local RF coil assembly on a patient table adapted to enter an imaging region of an MRI scanner.
Figure 2:
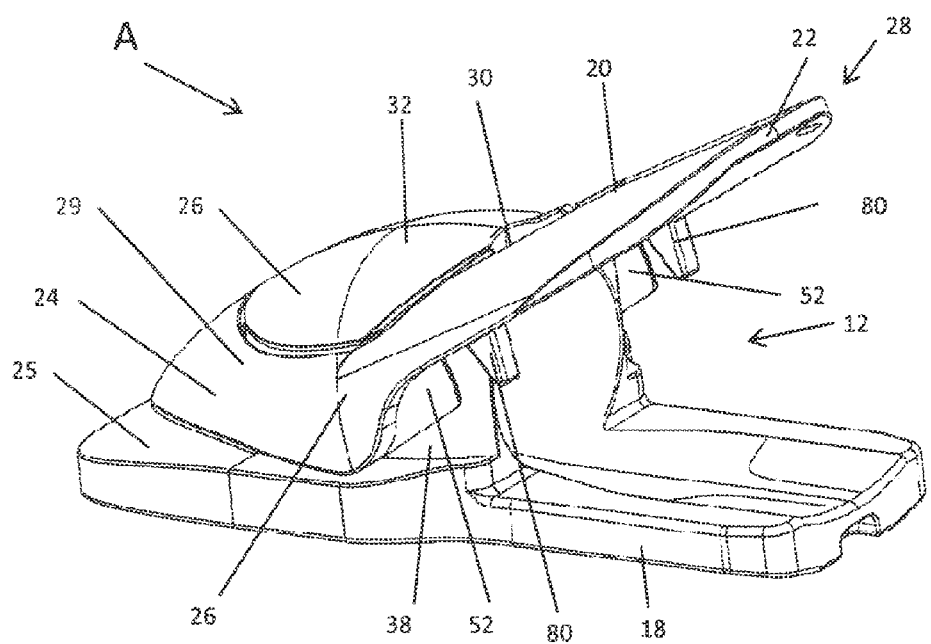
FIG. 2 is perspective view of the local RF coil system.

With reference to FIG. 1, a local RF coil assembly A is mounted to a patient supporting table or couch B. The couch B translates to place an associated pediatric patient C into and out of an imaging region D of a diagnostic scanner, particularly an MRI scanner E. The pediatric patient C is positioned in a pediatric patient carrier F along with any tubes, wires, monitors and medical apparatus in preparation for imaging. The preparation can be done outside of an MRI shielded room. The carrier F with the pediatric patient C is carried into the shielded room, placed on the patient support table B, and slid longitudinally into engagement with the local RF coil assembly A. After the local RF coil assembly A is closed, the patient support table B along with the local RF coil assembly A, the patient carrier F, and the associated pediatric patient C are transported into the imaging region D of the MRI scanner E. After imaging, this process is reversed.

With reference to FIGS. 1-5, the local RF coil assembly A is adapted to receive the associated pediatric patient C to be scanned in the imaging region D of the MRI scanner E. In one embodiment, the local RF coil assembly A defines a patient receiving region 12 that is defined by a rigid coil body and an adjustable coil part. In this embodiment, the rigid coil body includes a head coil 16 and a posterior coil 18 and the adjustable coil part includes an anterior or body coil 20. The body coil 20 is a simple lever and fulcrum type mechanism that includes a rigidly shaped body that operatively connects to the head coil 16 at a fulcrum along a hinge axis 26 or a rotational axis. (See FIG. 6) In one embodiment, the body coil 20 includes a proximal member 22 and a distal member 24. The proximal member 22 converges into the distal member 24 adjacent the hinge axis 26 such that the body coil 20 is balanced to be at rest in an open position 28. In the open position 28, the distal member 24 abuts a base 25 of the head coil 16 and the proximal member 22 is raised from the receiving region 12 and allows the carrier F to be received at the receiving region 12. In one embodiment, a counter-weight 29 is provided at the distal member 24 to balance the body coil at rest in the open position 28. The counter-weight 29 can be varied to achieve the appropriate balance of the assembly A.

In one embodiment, the body coil 20 includes an opening 30 that is operatively sized to adapt to a crown 32 of the head coil 16. The fulcrum of the body coil 20 and the hinge axis 26 are located below the crown 32. The fulcrum of the body coil 20 includes a first bearing 34 spaced from a second bearing 36 aligned along the hinge axis 26. Note FIGS. 6-12. Each bearing 34, 36 is movably attached to a bearing surface 38 below the crown 32 of the head coil 16. The bearing surface 38 partially surrounds the head coil 16 in a generally perpendicular manner relative to the posterior coil 18 such that the first bearing 34 is generally parallel to the second bearing 36 along the hinge axis 26.

Figure 3:
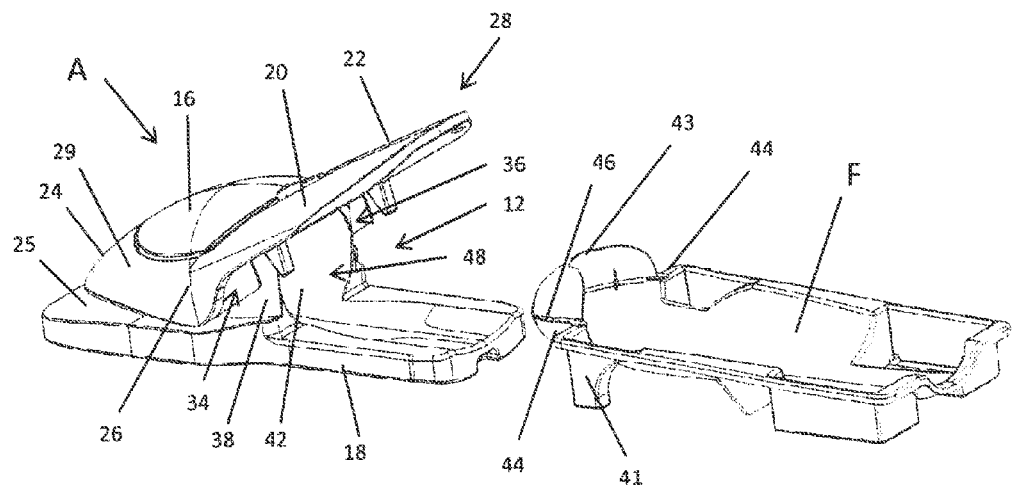
FIG. 3 is a perspective view of the local RF coil system with the carrier device.
Figure 4:
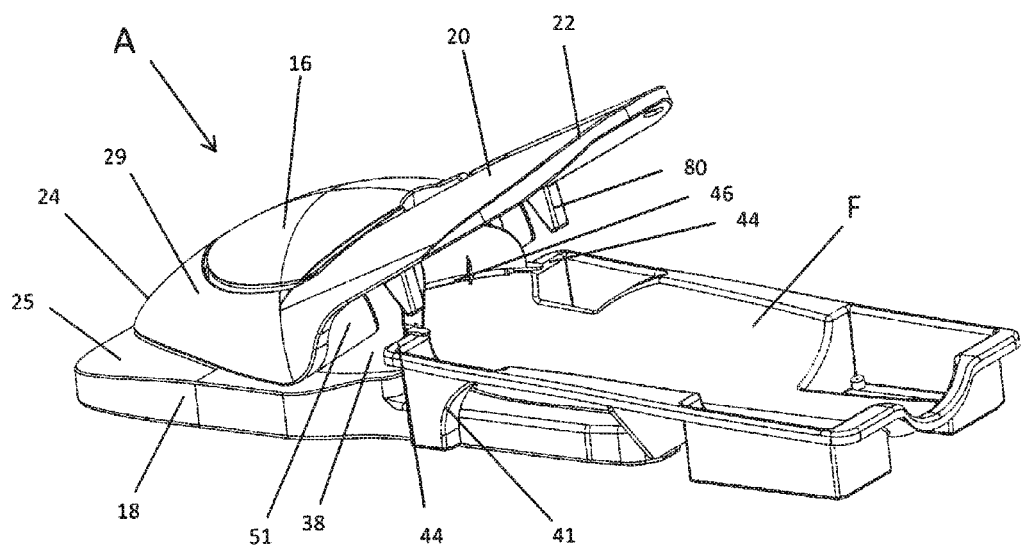
FIG. 4 is a perspective view of the local RF coil system with the carrier device positioned in a receiving region of the local RF coil in an open position.

With particular reference to FIG. 3, the patient carrier F has a bassinette like configuration that is adapted to slidably support the associated patient on the support table or couch B. The carrier F is slidably translatable along a common axis with the RF coil A to interact with the posterior coil 18 and abuttingly engage a mating surface 42 within the region 12 of the local RF coil A. (See FIG. 4) The carrier F includes shoulders 44 and a head surface 46 that are adapted to interact with the mating surface 42 of the RF coil assembly A. The carrier shoulders 44 are configured to engage the associated patient's shoulders to position the patient longitudinally in the carrier F. The mating surface 42 is located within the patient receiving region 12 and defines a cavity 48 within the head coil 16. In one embodiment, the cavity 48 intersects the hinge axis 26 and is interposed between the first bearing 34 and the second bearing 36.

Figure 5:
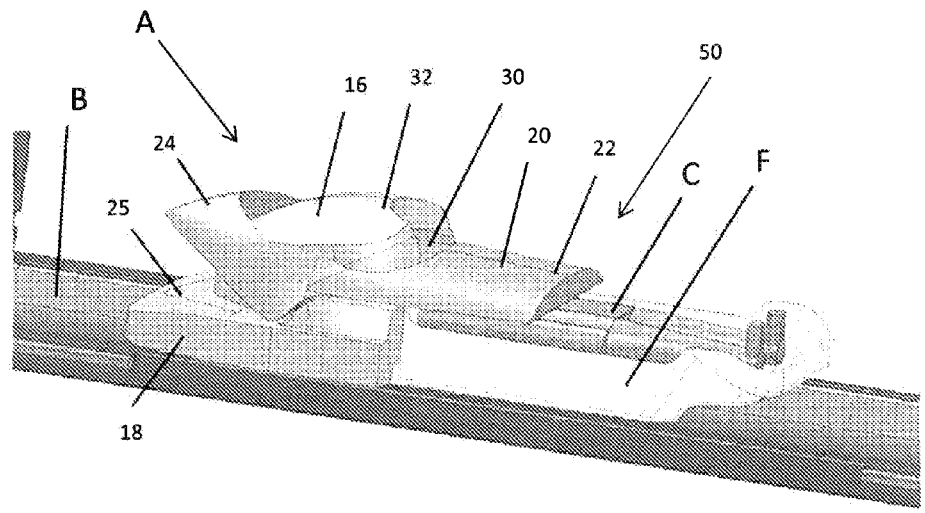
FIG. 5 is a perspective view of the local RF coil assembly with the carrier device positioned in the receiving region with the adjustable coil part held in a selected position.

The carrier shoulders 44 and the head surface 46 are shaped to abut the mating surface 42. The cavity 48 is configured to receive the head surface 46 and snuggly position the associated patient within the receiving region 12 at a suitable imaging position. The suitable position is a predetermined orientation of the associated pediatric patient relative to the local RF coil A and the magnetic imaging region D of the MRI scanner E to facilitate optimal magnetic imaging. With reference to FIG. 5, the body coil 20 is pivotable to a closed or selected position 50 such that the proximal member 22 of the body coil 20 is positioned in proximity to an area of interest to be imaged of the associated pediatric patient C.

The carrier F is configured to interact and align with a profile or guide surface of a posterior coil 18 to slidingly position the carrier F in axial alignment in a preferred imaging position within the receiving region 12 of the RF coil A. In one embodiment illustrated in FIGS. 3 and 4, the carrier F includes at least one leg 41 that protrudes from the shoulders 44 and slidingly engages the couch B and aligns along the posterior coil 18. The legs 41 and bottom portion of the carrier F conform to the profile of the posterior coil 18 such that the head surface 46 and shoulders 44 slide longitudinally over the posterior coil 18 to engage the RF coil A. The carrier F is optionally provided with a transparent guard 43 to protect the head of a patient from contacting the mating surface 42 in the cavity 48 of the receiving region 12.

Figure 6:
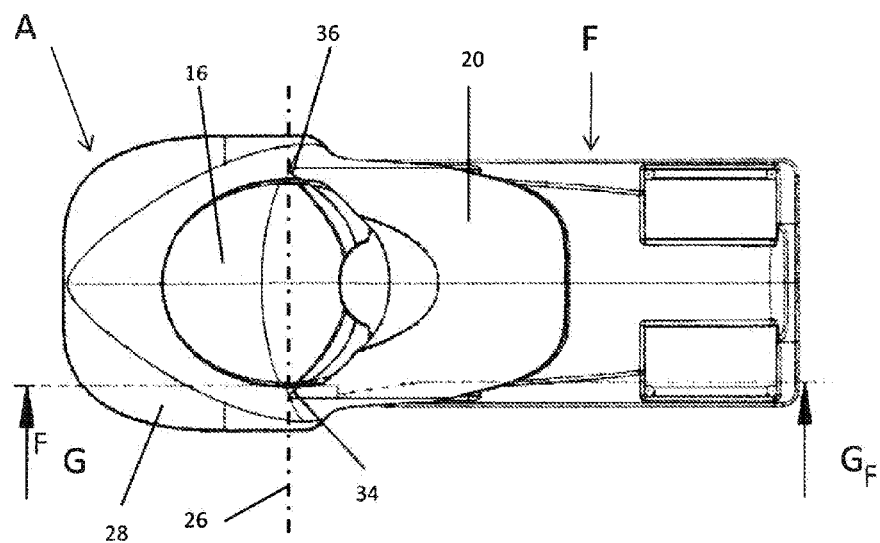
FIG. 6 is a top view of the local RF coil system with the carrier device positioned in the receiving region of the local RF coil.
Figure 7:
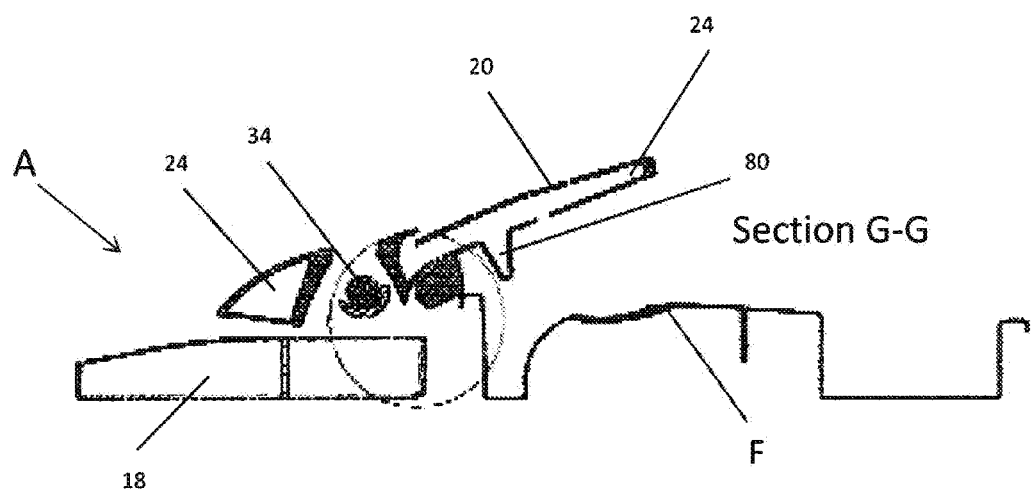
FIG. 7 is a cross sectional view along section G-G of FIG. 6 of the local RF coil system in an open position with the carrier device placed in the receiving region.
Figure 8:
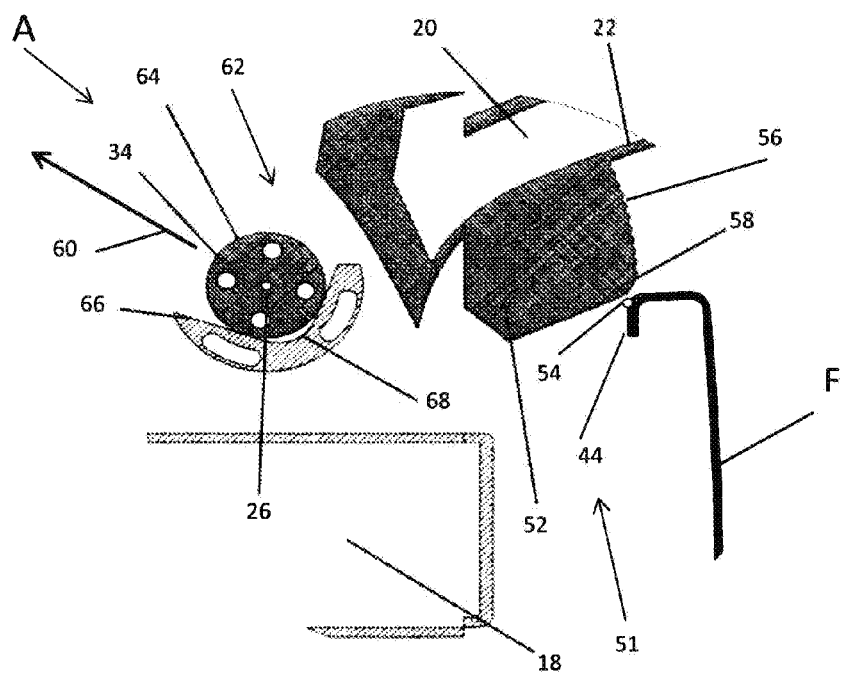
FIG. 8 is an exploded view of the cross sectional view along section G-G of FIG. 6 illustrating the interaction of the hinge and ratchet member of the local RF coil with the carrier device positioned in the receiving region.
Figure 9:
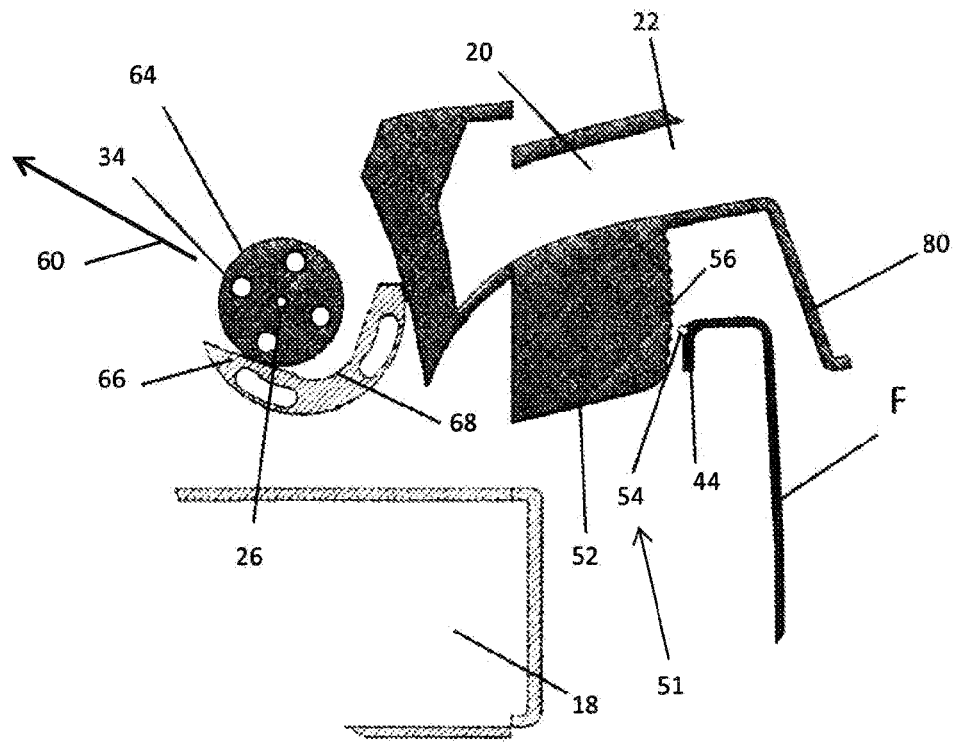
FIG. 9 is a cross sectional view along section G-G of FIG. 6 of the local RF coil assembly with the carrier device placed in the receiving region as the adjustable coil part is biased into a selected position relative to the carrier device.

With reference to FIG. 6, illustrated is a top view of the local RF coil assembly A and the carrier F (partially obscured by the body coil 20) positioned in the receiving region 12 of the local RF coil assembly A. Section line G-G intersects the RF coil assembly A, particularly the body coil 20 at the first bearing 34 traverse to the hinge axis 26 and the carrier F. Section line G-G illustrates cross sectional views of the RF coil assembly A as depicted by FIGS. 7-12 with particular focus on first bearing 34. It should be appreciated, that in certain embodiments, the second bearing 38 is arranged in a similar configuration as the first bearing 34.

In one embodiment, after the carrier F is positioned within the receiving region 12, an associated clinician manually moves the body coil 20 from the open position 28 to the selected position 50. The body coil 20 includes an interlock assembly 51 to hold the body coil 20 in the selected position 50. In one embodiment, the interlock assembly 51 includes at least one ratchet member 52 that extends from the proximal member 22 to communicate with an abutment surface 54 of the carrier F. The abutment surface 54 of the carrier F extends along the shoulders 44 and is shaped to interact with the ratchet member 52 as the proximal member 22 of the body coil is moved towards the selected position 50. In one embodiment, the ratchet member 52 includes a plurality of teeth 56 that are shaped to engage the abutment surface 54 and hold the body coil 20 in the selected position 50. In another embodiment, the abutment surface 54 includes at least one notch (not shown) adapted to engage the ratchet member 52. Notably, the ratchet member 52 disengages from the abutment surface 54 once the carrier is moved away from the local RF coil assembly A.

With reference progressively through FIGS. 7-10, the body coil 20 is illustrated as it moves from the open position 28 to the selected position 50. In these embodiments the first and second bearings 34, 36 are described to extend from the body coil 20 such that the body coil and the bearings move relative to the head coil 16 to bias the body coil toward the carrier F. However, it is also contemplated to provide bearings that extend from the head coil 16 such that the bearings do not move or bias relative to the body coil 20.

As the proximal member 22 is pivoted, an engagement point 58 of the ratchet member 52 makes contact with the carrier F at the abutment surface 54. As the body coil 20 is rotated at the hinge axis 26 from the open position 28 toward the selected position 50, at least one of the first and second bearings 34, 36 are translated away from an equilibrium position 62 (FIG. 8) in a first direction 60. In one embodiment, the first direction 60 is away from the carrier F. The contact between the engagement point 58 and carrier F urges the bearings 34, 36 to translate in a first direction 60 away from the carrier F due to the interaction between the ratchet member 52 and the abutment surface 54. The bearing 34 is a round hinge surface 64 around the hinge axis 26 that rests on a tilted sliding surface 66 along the bearing surface 38 of the head coil 16. The bearings 34, 36 are illustrated to be in an equilibrium position 62 when the round hinge surface 64 rests at a vertex 68 of the tilted sliding surface 66. (See FIG. 8) In one embodiment, the round hinge surface 64 rotates and translates in relation to the tilted sliding surface 66. The round hinge surface 64 translates in the first direction 60 along the tilted sliding surface 66 as the ratchet member 52 of the body coil 20 moves towards the selected position 50.

The sliding surface 66 slopes upward in the direction 60, such that as the interaction between the carrier F and the ratchet member 52 pushes the bearings 34, 36 away from the carrier F, the bearing 34, 36 and the body coil 20 are raised to a higher elevation by, the tilted sliding surface 66. The weight of the body coil 20 provides a gravity bias which urges the bearing 34 towards the equilibrium position 62 (FIG. 8) and the ratchet member 52 into engagement with the carrier F.

Notably, in the alternate embodiment (not shown), the tilted sliding surface 66 is positioned along a bearing surface of the body coil 20 and is configured to engage the bearings that extend from the head coil 16. In this embodiment, the tilted sliding surface 66 would be oppositely configured relative to the preferred embodiments such that the tilted sliding surface 66 translates and rotates relative to the bearings extending from the head coil 16 as the body coil is biased from the open position 26 toward the selected position 50.

In another embodiment, the gravity bias is replaced or supplemented by a spring bias.

Figure 10:
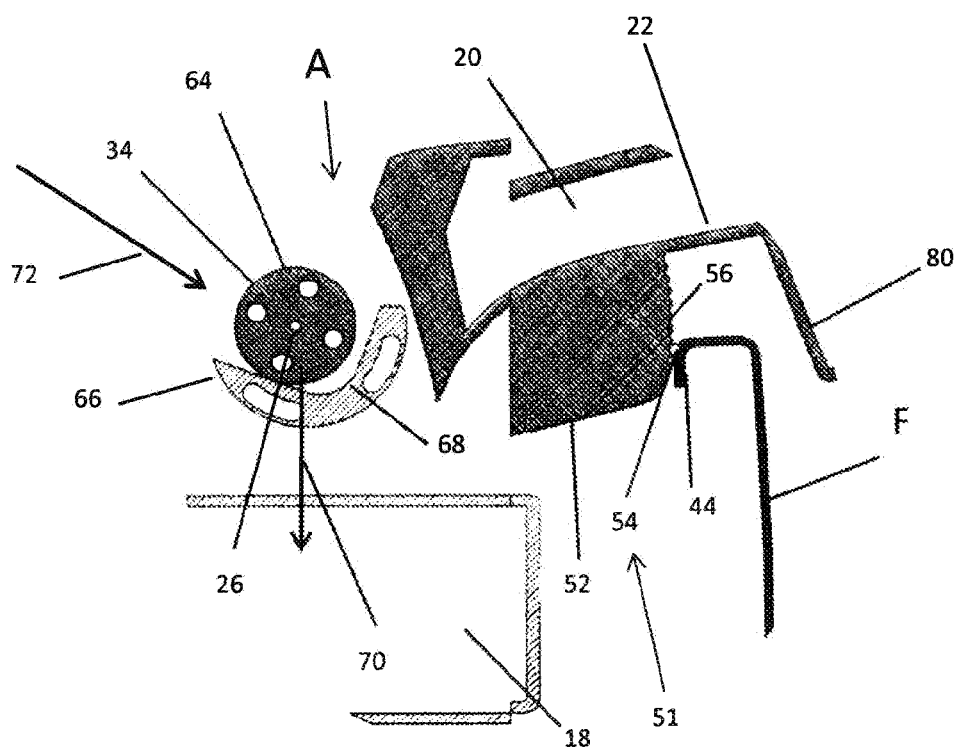
FIG. 10 is an exploded view of the cross sectional view of FIG. 9 illustrating the interaction of the hinge and ratchet member of the local RF coil with the carrier device placed in the receiving region as the adjustable coil part is biased into the selected position.

With reference to the illustrated embodiment, FIG. 10 illustrates the local RF coil assembly A subjected to the application of force by an associated clinician (not shown) to move the body coil 20 from the open position 28 to the selected position 50. The body coil 20 and ratchet member 52 are rotated manually about the hinge axis 26. The associated clinician can also apply a force to inhibit the teeth 56 from engaging the carrier F during positioning. Alternately, the interaction of the ratchet member 52 and the carrier F can convert the downward movement of the body coil 20 into motion parallel to the first direction 60. In this embodiment, the round hinge surface 64 is displaced from the vertex 68 along the tilted sliding surface 66 in the first direction 60 away from the carrier F. The spacing between the body coil 20 and carrier F is variable and can be selected by a force applied by the associated clinician against the gravity bias. The teeth 56 can engage the abutment surface 54 at various positions along the ratchet member 52 such that the selected position 50 is one of various selectable distances between the proximal member 22 and the pediatric patient in carrier F With reference to FIGS. 11 and 12, after or as the associated clinician moves the body coil 20 to the selected position 50, the force of gravity in a downward direction 70 urges the bearing 34 to translate the body coil 20 in a second direction 72. In one embodiment, the second direction 72 is parallel to the sliding surface 66 towards the carrier F. The biasing force urges the teeth 56 along the ratchet member 52 to engage the abutment surface 54 such that the body coil 20 can be held in the selected position 50. In this embodiment, the carrier F is not positively locked to the local RF coil A but rather are biased into engagement. The engagement is terminated in response to the carrier F being translated away from the local RF coil A. In one embodiment, as the gravity biasing force urges the bearing 34 in the second direction 72, the round hinge surface 64 moves along the tilted sliding surface 66 toward the vertex 68. The bearing 34 is gravity biased towards the equilibrium position 62.

The bearing 34 translation is due to the weight distribution of the body coil 20, the force of gravity, and the slope of the sliding surface 66. In another embodiment, the biasing force is provided by a spring or resilient member (not shown) connecting the bearing 34 of the body coil 20 to the head coil 16 and being operative to urge the bearing 34 towards the carrier F.

Figure 11:
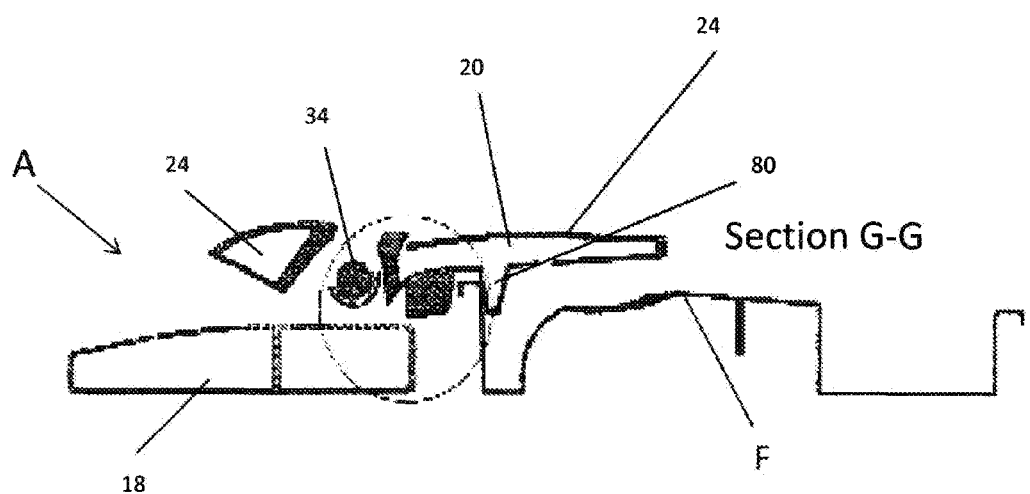
FIG. 11 is a cross sectional view of the local RF coil assembly with the carrier device placed in the receiving region as the adjustable coil part is held the selected position.
Figure 12:
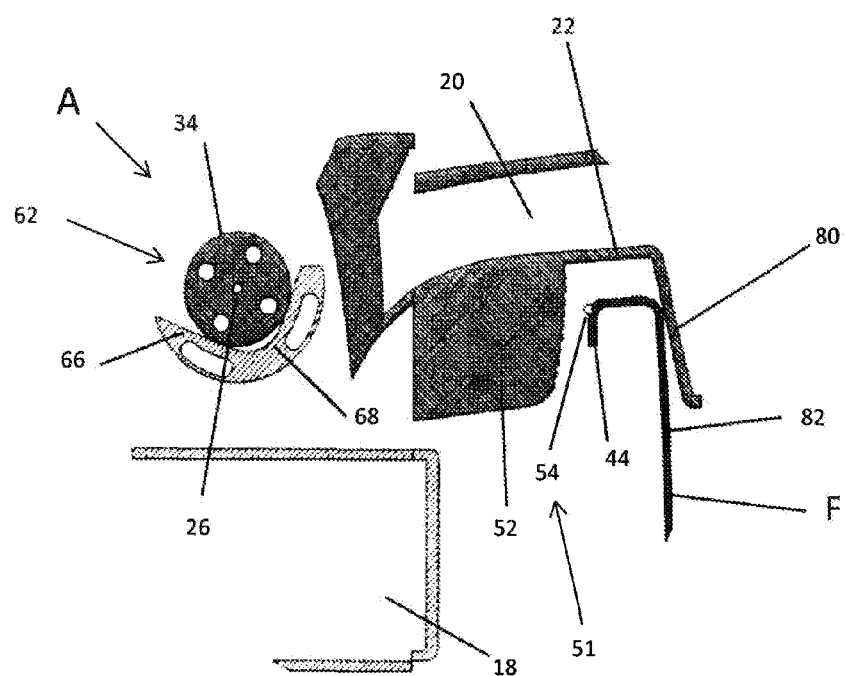
FIG. 12 is an exploded view of the cross sectional view of FIG. 10 illustrating the hinge biasing a ratchet member of the local RF coil into frictional engagement with the carrier device positioned in the receiving region as the ratchet member engages an abutment surface.
Figure 13:
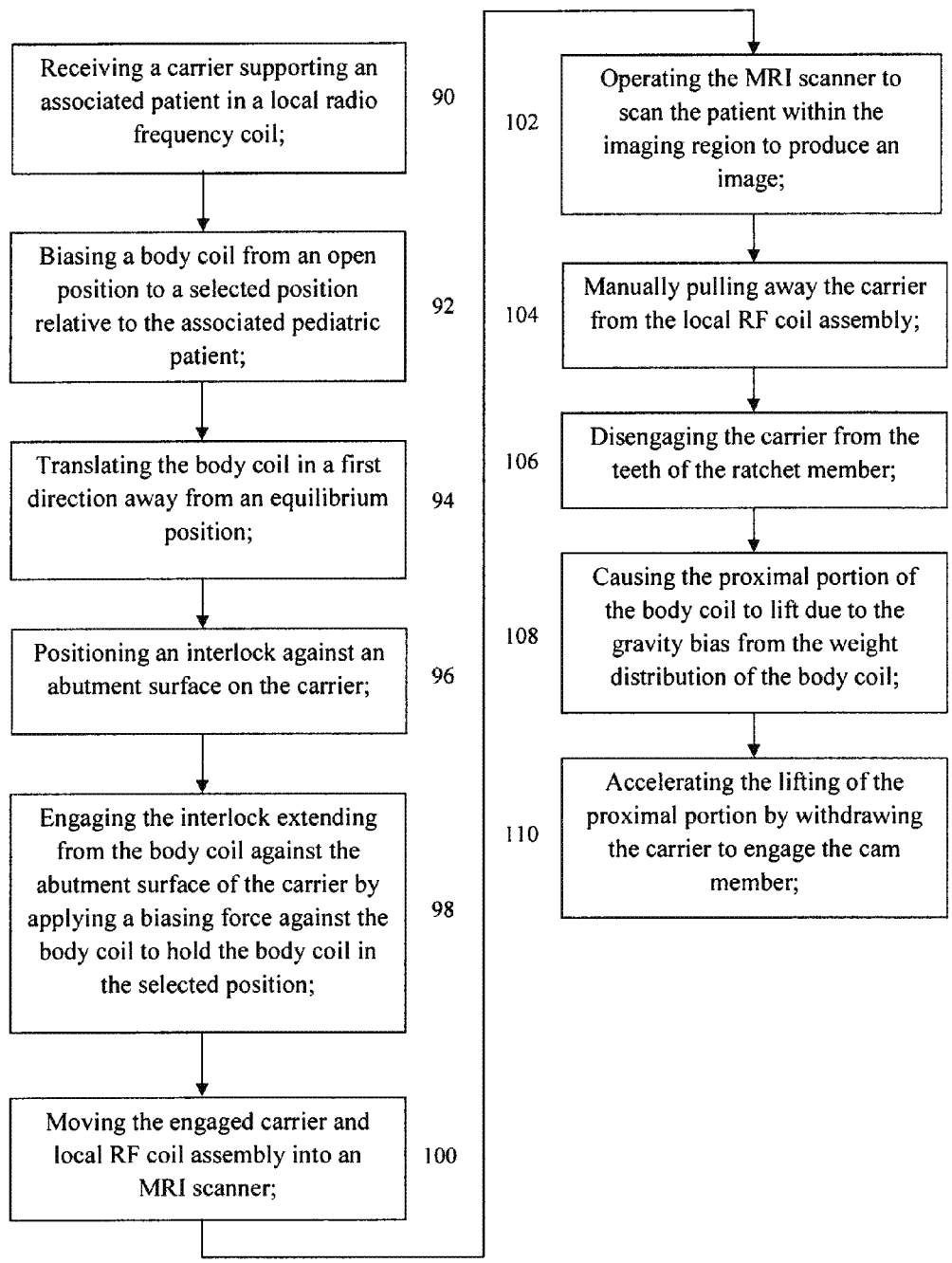
FIG. 13 is a cross sectional view of the local RF coil assembly with the carrier device traveling in a direction away from the receiving region releasing the ratchet member and engaging a cam surface of the adjustable coil part.

With reference to FIGS. 11 and 12, the RF coil assembly A is balanced to utilize gravity to bias the body coil 20 from the selected position 50 to the open position 28 once the abutment surface 54 and the ratchet member 52 disengage. The distal member 24 of the body coil 20 is weighted to automatically pivot about the hinge axis 26 until it rests against the base 25 of the head coil 16 by the force of gravity on the weight. Additionally, the bearing 34 returns to the equilibrium position 62. More particularly, the body coil 20 is balanced to be held in the selected position 50 by the interaction of a ratchet member 52 and the carrier F and to automatically rotate about the hinge axis 26 to the open position 28.

In accordance with another aspect, a cam member 80 extends from the proximal member 22 of the body coil 20 and interacts with an inner surface 82 of the carrier F as the carrier F is withdrawn. The cam member 80 is configured with an angled cam surface 84 which engages the inner surface 82 to accelerate a speed at which the proximal member 22 of the body coil 20 pivots to the open position 28. This feature assures that the patient will not collide with the body coil 20 as the carrier F is translating away from the local RF coil assembly A.

In accordance with another aspect, a method for handling the pediatric patient within an MRI scanner sized to accept and scan an adult patient. The carrier F along with the pediatric patient C is axially aligned with the RF coil assembly A on the patient support table B. The carrier F supporting an associated pediatric patient is received into engagement with the local RF coil assembly A at 90. The carrier F is slidingly aligned with the posterior coil 18 and properly positioned within the patient receiving region 12. The carrier shoulders 44 and head surface 46 slide into the cavity 48 of the patient receiving region 12 of the RF coil assembly A. The carrier F is releasably held in the cavity by a detent and recess arrangement, or the like which easily releases when the carrier F is pulled away from the RF coil assembly A. The body coil 20 is biased by gravity to the open position 28 by a weight in the distal member 24. The body coil 20 is moved from the open position 28 towards the selected position 50 at 92. The body coil 20 is operatively connected to first and second bearings 34, 36 on a head coil 16 of the local RF coil assembly A about which the body coil 20 rotates during movement by an associated clinician to cover the associated pediatric patient C to be scanned. In one embodiment, the body coil 20 and bearings 34, 36 are urged to translate in a first direction 60 away from the equilibrium position 62 by the clinician moving the body coil towards the selected position 50 at 94. In one embodiment, the bearings 34, 36 and the body coil 20 are urged in the first direction 60 by interaction of the ratchet member 52 and the carrier F when the clinician has moved the body coil 20 to the selected position 50. The teeth 56 along the ratchet member 52 engage the abutment surface 54 to hold the body coil in the selected position 50 at 96. The body coil 20 and the teeth 56 on the ratchet member 52 are gravity biased against the abutment surface 54 of the carrier F to hold or retain the body coil 20 in the selected position 50 relative to the carrier F at 98.

The table with the engaged carrier F and the RF coil assembly A are moved into the imaging region D of the MRI scanner E at 100. The MRI scanner is then operated to scan the patient within the imaging region D to produces an image at 102.

If the patient has a medical emergency and needs to be removed for immediate medical attention, the carrier F is manually pulled away from the local RF coil assembly A at 104. The motion of the carrier F away from the RF coil assembly A disengages the carrier from the teeth 56 of the ratchet member 52 at 106. Without the engagement between the teeth and the carrier, the gravity bias from the weight distribution of the body coil 20 causes the proximal portion 22 of the body coil to lift at 108. The cam member 80 is engaged by the withdrawing carrier F accelerating the lifting of the proximal portion at 110.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A local radio frequency coil assembly adapted to receive an associated patient to be scanned in a magnetic resonance imaging scanner, the assembly comprising:
   a patient carrier;
   a head coil defining a pediatric patient receiving region which receives the carrier;
   a posterior coil attached to the head coil and is configured to be mounted to a patient support table of the magnetic resonance imaging scanner;
   an anterior body coil pivotally mounted to the head coil by a hinge element to pivot between an open position and a selected position above a portion of the carrier;
   an interlock assembly which holds the anterior body coil in the selected position; and
   a biasing arrangement which biases a ratchet element of the interlock assembly into engagement with the carrier.

2. A local RF coil assembly configured to receive an associated pediatric patient to be scanned in a magnetic resonance imaging scanner, the assembly comprising:
   a pediatric patient carrier configured to receive the pediatric patient and be movably supported on and moved axially along a patient support table of the magnetic resonance imaging scanner;
   a coil assembly configured to define a pediatric patient receiving region which receives the pediatric patient carrier and at least a portion of the pediatric patient received in the carrier, the coil assembly being configured to be mounted to the patient support table of the magnetic resonance imaging scanner, the coil assembly including:
      a posterior coil disposed below the pediatric patient receiving region and configured to receive at least a portion of the pediatric patient carrier thereover as the pediatric patient carrier moves axially along the patient support table into the pediatric patient receiving region,
      an anterior body coil pivotally mounted to the coil assembly by a hinge element to pivot between an open position configured to receive the pediatric patient carrier and a selected position above a portion of the carrier when the pediatric patient carrier is in the pediatric patient receiving region, the anterior body coil being biased to the open position,
      an interlock assembly configured to engage the received pediatric patient carrier when the pediatric patient carrier is in the pediatric patient receiving region and hold the anterior body coil in the selected position, and
      a biasing arrangement configured to bias the interlock assembly into engagement with the carrier when the pediatric patient carrier is in the pediatric patient receiving region,
   wherein the interlock assembly is configured to release the anterior body coil portion in response to movement of the patient carrier axially along the patient support table away from the pediatric patient receiving region.

3. A local radio frequency (RF) coil assembly adapted to receive an associated pediatric patient to be scanned in a magnetic resonance imaging scanner, the assembly comprising:
   a patient carrier configured to receive the associated pediatric patient;
   a head coil defining a pediatric patient receiving region which receives the carrier;
   a posterior coil attached to the head coil, and wherein the posterior coil and the head coil are configured to be mounted to a patient support table of the magnetic resonance imaging scanner;
   an anterior body coil pivotally mounted to the head coil by at least one bearing operably connects the anterior body coil to the head coil to pivot about a hinge axis between an open position and a selected position above a portion of the carrier, wherein the at least one bearing is configured for movement along a sloping surface and the at least one bearing and the anterior body coil are pivoted and are arranged for being biased by at least one of gravity or spring force to move towards the carrier along the sliding surface in the selected position;
   an interlock assembly which is configured to hold the anterior body coil in the selected position; and
   a biasing arrangement which is configured to bias by at least one of gravity or spring force a ratchet member of the interlock assembly into engagement with the carrier to hold the anterior body coil in the selected position.

4. The local RF coil assembly according to claim 1 wherein the interlock assembly includes:
   the ratchet member that extends from the anterior body coil and is biased to engage an abutment surface of the carrier to hold the anterior body coil in the selected position.

5. The local RF coil assembly according to claim 1 further including:
   a cam member extending from the body coil and configured to interact with the carrier to accelerate a speed at which the adjustable coil part pivots from the selected position to the open position when the carrier is withdrawn from the patient receiving region.

6. The local RF coil assembly according to claim 1 wherein gravity biases the anterior body coil into the open position.

7. The local RF coil assembly according to claim 1 wherein the bias arrangement is configured to bias at least one bearing and the anterior body coil towards the carrier along a sliding surface.

8. The local RF coil assembly according to claim 1 wherein the anterior body coil includes a distal member and a proximal member, the distal member converges with the proximal member adjacent the hinge element, the proximal member is configured to cover a torso portion of the associated patient.

9. The local RF coil assembly according to claim 1 further including the at least one bearing configured to translate the anterior body coil relative to an equilibrium position and to pivot the anterior body coil between the open position and the selected position.

10. The local RF coil assembly according to claim 9, wherein the at least one bearing is in the equilibrium position when the adjustable coil part is in the open position.

11. The local RF coil assembly according to claim 9 wherein the interlock assembly includes:
the ratchet member that extends from the anterior body coil and is biased to engage an abutment surface of the carrier to hold the anterior body coil in the selected position and
wherein as an associated user pivots the anterior body coil to the selected position, the at least one bearing translates in a first direction away from the equilibrium position as a portion of the ratchet member is pivoted adjacent the abutment surface on the carrier.

12. The local RF coil assembly according to claim 11, wherein a biasing force is applied to urge at least one bearing to translate in a second direction and to urge a plurality of teeth on the ratchet member to engage an abutment surface and hold the body coil in the selected position.

13. A method of handling a pediatric patient within a magnetic resonance imaging scanner configured to accept and image an adult patient, the method comprising:
receiving a carrier carrying an associate pediatric patient in a carrier receiving region of a local radio frequency coil assembly;
pivoting an anterior body coil from an open position to a selected position relative to the associated pediatric patient, in the selected position the anterior body coil is configured to image a torso portion of the pediatric patient carried in the carrier; and
biasing an interlock element extending from the anterior body coil towards the carrier such that the interlock element engages an abutment surface of the carrier and holds the anterior body coil in the selected position.

14. The method according to claim 13 wherein gravity biases the anterior body coil to the open position.

15. The method according to claim 13 further comprising:
moving the carrier in a direction to withdraw the carrier from the carrier receiving region;
the moving of the carrier releasing the interlock element from engagement with the abutment surface of the carrier; and
in response to releasing the engagement of the interlock element and the abutment surface, pivoting the anterior body coil from the selected position to the open position with at least one of a gravity and spring bias.

16. The method according to claim 13 wherein the local radio frequency coil assembly includes a head coil configured to image a head of the pediatric patient carried in the carrier and the anterior body coil is pivotally connected to the head coil by at least one bearing, the at least one bearing element moves along a sloping surface as the anterior body coil pivots between the open position and the selected position to bias the interlock element into the releasable engagement with the abutment surface of the carrier.

17. The method according to claim 13 further comprising:
accelerating a rate of speed in which the anterior body coil pivots from the selected position to an open position by engaging the carrier against a cam member extending from the body coil as the carrier is withdrawn.

18. A local radio frequency (RF) coil assembly configured to adapt an adult magnetic resonance imaging scanner to image pediatric patients, the local RF coil assembly comprising:
a rigid coil body defining a pediatric patient receiving region and configured to receive a portion of the associate pediatric patient carried in a carrier and supported on a patient support table of the magnetic resonance imaging scanner;
an adjustable coil part operatively mounted to the rigid coil body with at least one bearing and configured to pivot between an open position to facilitate reviewing the carrier and the carried pediatric patient and a selected position to facilitate magnetic resonance imaging of a body portion of the pediatric patient; and
a cam member extending from the adjustable coil part and configured to engage the carrier and to accelerate pivoting the adjustable coil part to the open position as the carrier is withdrawn from the pediatric patient receiving region of the rigid coil body.

19. The local RF coil assembly according to claim 18, wherein the at least one bearing is configured to move along a sloping surface to gravity bias an interlock member to engage to an abutment surface of the carrier to releasably hold the adjustable coil part in the selected position during magnetic resonance imaging.

20. The local RF coil assembly according to claim 18, further including:
a head coil mounted in the rigid coil body and configured to facilitate magnetic resonance imaging of a head of the pediatric patient carried in the carrier;
a posterior body coil extending from the rigid coil body below the pediatric patient receiving region, the adjustable coil part and the posterior coil portion being configured to cooperatively facilitate magnetic resonance imaging of the body portion of the pediatric patient.

\* \* \* \* \*